(12) United States Patent
Plofsky et al.

(10) Patent No.: US 8,758,961 B1
(45) Date of Patent: Jun. 24, 2014

(54) MASK SET FOR FABRICATING INTEGRATED CIRCUITS AND METHOD OF FABRICATING INTEGRATED CIRCUITS

(75) Inventors: Jordan Plofsky, San Jose, CA (US); Chooi Pei Lim, Bayan Lepas (MY); Danny Biran, Cupertino, CA (US); Francis Man-Chit Chow, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 188 days.

(21) Appl. No.: 13/246,761

(22) Filed: Sep. 27, 2011

(51) Int. Cl.
*G03F 9/00* (2006.01)
(52) U.S. Cl.
USPC ............................... 430/5; 430/394
(58) Field of Classification Search
USPC .............................. 430/5, 394; 716/53, 55, 54
See application file for complete search history.

(56) References Cited

U.S. PATENT DOCUMENTS

2008/0274417 A1* 11/2008 Sturtevant et al. ................. 430/5
2011/0113389 A1* 5/2011 Lin et al. ......................... 716/53

OTHER PUBLICATIONS

U.S. Appl. No. 12/352,705, Landis, Lawrence David.

* cited by examiner

*Primary Examiner* — Stephen Rosasco
(74) *Attorney, Agent, or Firm* — Mauriel Kapouytian Woods LLP; Avarat Kapouytian

(57) ABSTRACT

A mask set is described. In one implementation, the mask set includes: a first layer mask including a plurality of first tiles of a first tile size; and a second layer mask including a plurality of second tiles of a second tile size, where the second tile size is different from the first tile size. Also, a method of fabricating a plurality of integrated circuits (ICs) is described. In one implementation, the method includes: using a first layer mask having a first tile size to fabricate a first layer of a first IC of the plurality of ICs and a first layer of a second IC of the plurality of ICs; and using a second layer mask having a second tile size to fabricate a second layer of the first IC, where the second tile size is different from the first tile size.

19 Claims, 10 Drawing Sheets

MASK SET FOR FABRICATING INTEGRATED CIRCUITS AND METHOD OF FABRICATING INTEGRATED CIRCUITS

BACKGROUND

Integrated circuit (IC) fabrication involves use of masks. The number of masks for fabricating an IC corresponds to the number of layers in the IC. Thus, the mask cost for fabricating an IC increases with the increasing number of layers in an IC. Additionally, each sized IC requires its own set of masks. Thus, fabricating ICs of N different sizes requires N times as many masks as fabricating ICs of one size, where N is an integer greater than one.

One proposed solution for reducing mask costs for fabricating multiple size ICs involves the use of masks having tiles of the same size for all masks needed for fabricating the ICs. These same masks are used for fabricating all layers of the ICs of the different sizes. Thereafter, the size of the IC fabricated is determined by the number of tiles included in the IC that is cut from the wafer. In this proposed solution, each tile has connections with all the tiles next to it. When a tile is separated from its neighboring tile, the connections between the tile and the neighboring tile are exposed. This creates reliability problems.

SUMMARY

One embodiment of the present invention provides a mask set including: a first layer mask including a plurality of first tiles of a first tile size; and a second layer mask including a plurality of second tiles of a second tile size, where the second tile size is different from the first tile size.

Another embodiment of the present invention provides a method of fabricating a plurality of integrated circuits (ICs), the method including: using a first layer mask having a first tile size to fabricate a first layer of a first IC of the plurality of ICs and a first layer of a second IC of the plurality of ICs; and using a second layer mask having a second tile size to fabricate a second layer of the first IC, where the second tile size is different from the first tile size.

Embodiments of the present invention reduce mask costs by allowing for sharing masks in the fabrication of different size ICs while avoiding the problem of exposed connections between tiles as a result of cutting along scribe lines between the tiles.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
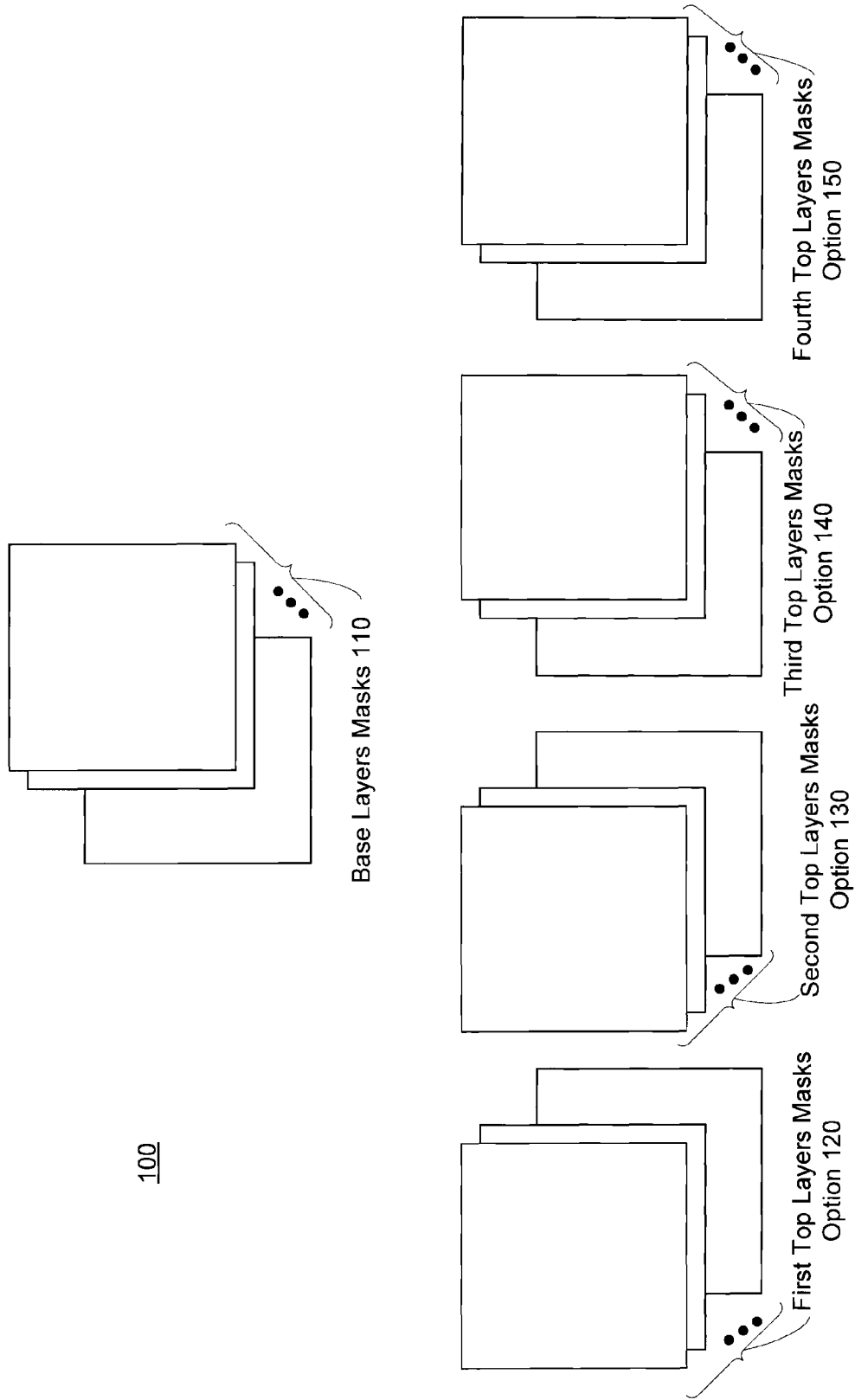
FIG. 1 is a schematic diagram of one embodiment of a mask set used in the fabrication of a family of integrated circuits (ICs).

FIG. 1 is a schematic diagram of one embodiment of a mask set used in the fabrication of a family of integrated circuits (ICs). In FIG. 1, mask set 100 includes base layers masks 110, first top layers masks option 120, second top layers masks option 130, third top layers masks option 140, and fourth top layers masks option 150. In one embodiment, base layers masks 110 are the masks for fabricating the resources (e.g., devices) of an IC. In one embodiment, base layers masks 110 are the masks for fabricating layers up to metal layer M6 of an IC. More specifically, in one embodiment, base layers masks 110 are the masks for fabricating metal layers M1 to M6, via layers between metal layers M1 to M6, and all layers below the metal layers M1 to M6 (e.g., implant layers, gate oxide layers). Also, in one embodiment, each option of top layers masks options 120 to 150 includes masks for fabricating IC pads, passivation layers of the IC, and interconnections between resources of the IC. Also, in one embodiment, each option of top layers masks options 120 to 150 includes the masks for fabricating power and signal interconnections between primitive tiles represented by base mask layers 110. More specifically, in one embodiment, each option of top layers masks options 120 to 150 includes the mask for fabricating metal layers M7 to M9, as well as aluminum passivation (AP) layers and pad layers. In another embodiment, base layers masks 110 are masks for fabricating up to metal layers M5, rather than M6. Also, in another embodiment, each option of top layers masks options 120 to 150 includes masks for fabricating layers M6 to M9, as well as aluminum passivation (AP) layers and pad layers.

Mask set 100 is used in the fabrication of a family of ICs. More specifically, it is used in the fabrication of a family of four ICs. In one embodiment, mask set 100 is used in the fabrication of a family of ICs that are field programmable gate arrays (FPGAs). Base layers masks 110 are used in the fabrication of each of the four ICs, instead of using four different versions of base layers masks, one for each of the four ICs. This provides significant savings in mask design and production costs because only one set of base layers masks is designed and produced, instead of four.

In one embodiment, each of base layers masks 110 is designed using a first tile size, which may herein also be referred to as a primitive tile size. A tile is the smallest area defined by scribe lines available for cutting a wafer into an IC die. Each of base layers masks 110 includes a plurality of primitive size tiles. Each primitive size tile represents a small scale monolithic device that contains a full set of hardware resources. In one embodiment, where the IC is an FPGA, each primitive size tile represents a full set of FPGA hardware resources. In one embodiment, each primitive size tile may include 12 transceivers, 244 input/output (I/O) devices, and $240 \times 10^3$ logic elements (LEs). In another embodiment, each primitive size tile may include 9 transceivers, 186 I/O devices, and $150 \times 10^3$ LEs.

Also, in one embodiment, one option of top layers masks options 120-150 is designed using the primitive tile size, whereas the remaining options of top layers masks options 120-150 are designed using a tile size that is an integer multiple (other than one) of the primitive tile size. In one embodiment, first top layers masks option 120, second top layers masks option 130, third top layers masks option 140, and fourth top layers masks option 150 are designed using tile sizes that are one time (×1), two times (×2), three times (×3), and six times (×6), respectively, of the primitive tile size. In such an embodiment, first top layers masks option 120, second top layers masks option 130, third top layers masks option 140, and fourth top layers masks option 150 are used for fabricating ICs that have one time (×1), two times (×2), three times (×3), and six times (×6), respectively, of the resources in a primitive tile of the size in base layers masks 110. In another embodiment, first top layers masks option 120, second top layers masks option 130, third top layers masks option 140, and fourth top layers masks option 150 are designed using tile sizes that are one time (×1), two times (×2), four times (×4), and eight times (×8), respectively, of the primitive tile size. In such an embodiment, first top layers masks option 120, second top layers masks option 130, third top layers masks option 140, and fourth top layers masks option 150 are used for fabricating ICs that have one time (×1), two times (×2), four times (×4), and eight times (×8), respectively, of the resources in a primitive tile of the size in base layers masks 110. In yet another embodiment, first top layers masks option 120, second top layers masks option 130, third top layers masks option 140, and fourth top layers masks option 150 may have a proportion of resources relative to the primitive tile that is different from the proportions in the above-mentioned embodiments. Also, in another embodiment, there may be a different number of top layers masks options than that of FIG. 1.

In one embodiment, base layers masks 110 and top layers masks options 120-150 are both for fabricating resources or layers of an IC at the same process node. In another embodiment, base layers masks 110 may be for fabricating first layers or resources of an IC at a first process node (e.g., 28 nanometers (nm)), whereas top layers mask options 120-150 are for fabricating second layers or resources of the IC at a second process node (e.g., 40 nm), where the second layers include interconnections between the first layers or resources.

Figure 2:
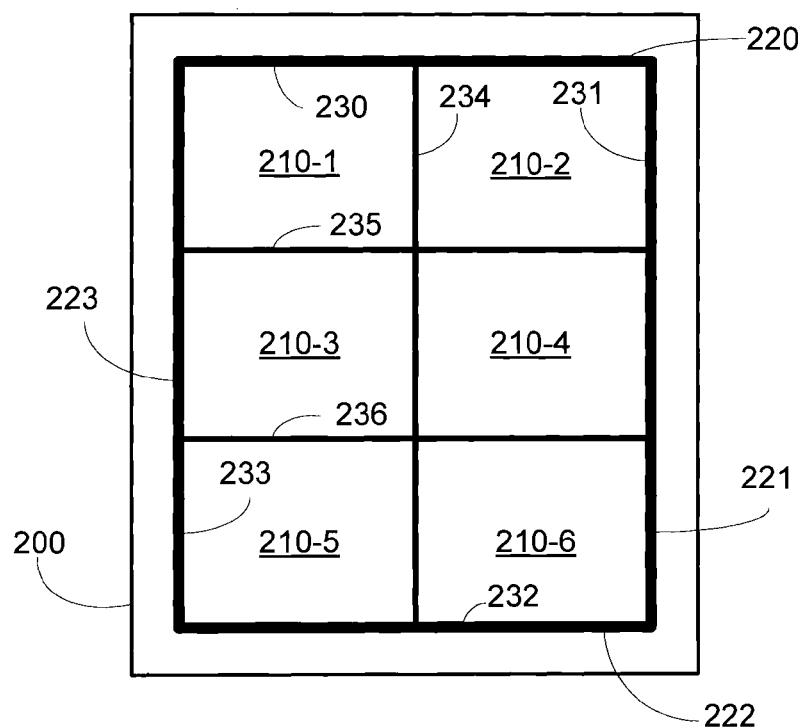
FIG. 2 is a schematic diagram of one embodiment of a mask reticle for a base layer mask.

FIG. 2 is a schematic diagram of one embodiment of a mask reticle for a base layer mask. In FIG. 2, mask reticle 200 includes six primitive tiles 210-1 to 210-6. In one embodiment, each of primitive tiles 210-1 to 210-6 is surrounded by an inner scribe line, such as inner scribe lines 230-236. Each primitive tile is the smallest area defined by the scribe lines surrounding that primitive tile. For example, primitive tile 210-1 is the smallest area defined by scribe lines 230, 234, 235, and 233. Also, in one embodiment, primitive tiles 210-1 to 210-6 are collectively surrounded by outer scribe lines 220-223. In one embodiment, outer scribe lines 220-223 are thicker than the inner scribe lines 230-236. In one embodiment, each of outer scribe lines 220-223 is 240 μm thick, whereas each of inner scribe lines 230-236 is 80 μm thick. In one embodiment, such as that shown in FIG. 2, outer scribe lines 220, 221, 222, and 223 are contiguous with inner scribe lines 230, 231, 232, and 233, respectively.

In one embodiment, mask reticle 200 is 25 mm by 25 mm. Also, in one embodiment, each of primitive tiles 210 is 10.237 mm by 8.016 mm.

Figure 3:
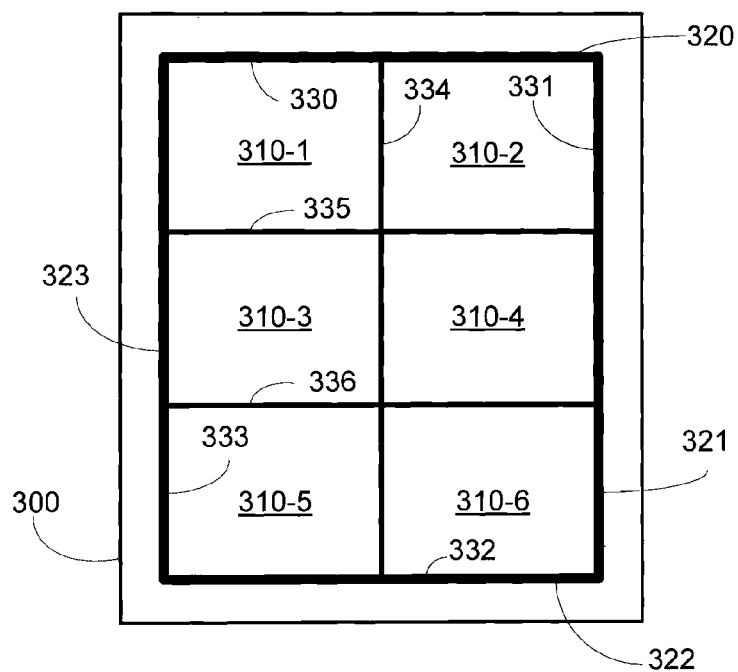
FIG. 3 is a schematic diagram of one embodiment of a mask reticle for a mask in a top layers masks option.

FIG. 3 is a schematic diagram of one embodiment of a mask reticle for a mask in a top layers masks option. More specifically, FIG. 3 is a schematic diagram of one embodiment of a mask reticle for a mask in a first top layers masks option, e.g., first top layers masks option 120 (shown in FIG. 1). In FIG. 3, mask reticle 300 includes six tiles 310-1 to 310-6. In one embodiment, each of tiles 310-1 to 310-6 is surrounded by an inner scribe line, such as inner scribe lines 330-336. Each tile is the smallest area defined by the scribe lines surrounding that tile. For example, tile 310-1 is the smallest area defined by scribe lines 330, 334, 335, and 333. Also, in one embodiment, tiles 310-1 to 310-6 are collectively surrounded by outer scribe lines 320-323. In one embodiment, outer scribe lines 320-323 are thicker than the inner scribe lines 330-336. In one embodiment, each of outer scribe lines 320-323 is 240 μm thick, whereas each of inner scribe lines 330-336 is 80 μm thick. In one embodiment, such as that shown in FIG. 3, outer scribe lines 320, 321, 322, and 323 are contiguous with inner scribe lines 330, 331, 332, and 333, respectively.

In one embodiment, mask reticle 300 is 25 mm by 25 mm. Also, in one embodiment, each of tiles 310-1 to 310-6 is 10.237 mm by 8.016 mm. It is to be noted that tiles 310-1 to 310-6 in mask reticle 300 have the same size as primitive tiles 210-1 to 210-6 in reticle 200 (shown in FIG. 2). In other words, mask reticle 300 is a mask for a top layers masks option used for fabricating an IC that has one time (×1) the resources in one of primitive tile 210-1 to 210-6.

In reticle 300, some tiles, e.g., tiles 310-1 and 310-2, tiles 310-3 and 310-4, and tiles 310-5 and 310-6, are shown to share inner scribe line 334. In another embodiment, each of tiles 310-1 to 310-6 would be surrounded by its own inner scribe lines that are not shared with another tile. In such an embodiment, there may be a gap between the inner scribe line for one tile and the inner scribe line for another neighboring tile. For example, instead of only inner scribe line 334 between tiles 310-1 and 310-2, there would be two inner scribe lines, one for tile 310-1 and another for tile 310-2 and there would be a gap between the inner scribe line for tile 310-1 and the inner scribe line for tile 310-2.

Figure 4:
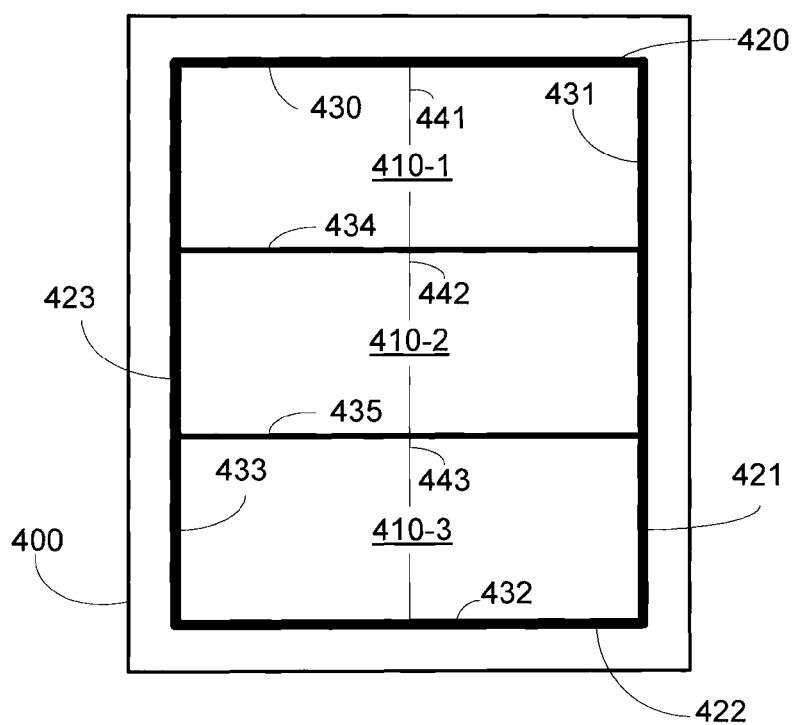
FIG. 4 is a schematic diagram of another embodiment of a mask reticle for a mask in a top layers masks option.

FIG. 4 is a schematic diagram of another embodiment of a mask reticle for a mask in a top layers masks option. More specifically, FIG. 4 is a schematic diagram of one embodiment of a mask reticle for a mask in a second top layers masks option, e.g., second top layers masks option 130 (shown in FIG. 1). In FIG. 4, mask reticle 400 includes three tiles 410-1 to 410-3. In one embodiment, each of tiles 410-1 to 410-3 is surrounded by an inner scribe line, such as inner scribe lines 430-435. Each tile is the smallest area defined by the scribe lines surrounding that tile. For example, tile 410-1 is the smallest area defined by scribe lines 430, 431, 434, and 433. Also, in one embodiment, tiles 410-1 to 410-3 are collectively surrounded by outer scribe lines 420-423. In one embodiment, outer scribe lines 420-423 are thicker than the inner scribe lines 430-435. In one embodiment, each of outer scribe lines 420-423 is 240 μm thick, whereas each of inner scribe lines 430-435 is 80 μm thick. In one embodiment, such as that shown in FIG. 4, outer scribe lines 420, 421, 422, and 423 are contiguous with inner scribe lines 430, 431, 432, and 433, respectively.

Mask reticle 400 also includes metalized tile to tile connections 441, 442, and 443 for connecting primitive size tiles to form tiles 410-1 to 410-3, each of which is twice as large as a primitive size tile.

In one embodiment, mask reticle 400 is 25 mm by 25 mm. Also, in one embodiment, each of tiles 410-1 to 410-3 is 20.474 mm by 8.016 mm. It is to be noted that tiles 410-1 to 410-3 in mask reticle 400 are twice as large as one of primitive tiles 210-1 to 210-6 in reticle 200 (shown in FIG. 2). In other words, mask reticle 400 is a mask for a top layer option used for fabricating an IC that has two times (×2) the resources in one of primitive tiles 210-1 to 210-6.

In reticle 400, some tiles, e.g., tiles 410-1 and 410-2 are shown to share inner scribe line 434. In another embodiment, each of tiles 410-1 to 410-3 would be surrounded by its own inner scribe lines that are not shared with another tile. In such an embodiment, there may be a gap between the inner scribe line for one tile and the inner scribe line for another neighboring tile. For example, instead of only inner scribe line 434 between tiles 410-1 and 410-2, there would be two inner scribe lines, one for tile 410-1 and another for tile 410-2 and there would be a gap between the inner scribe line for tile 410-1 and the inner scribe line for tile 410-2.

Figure 5:
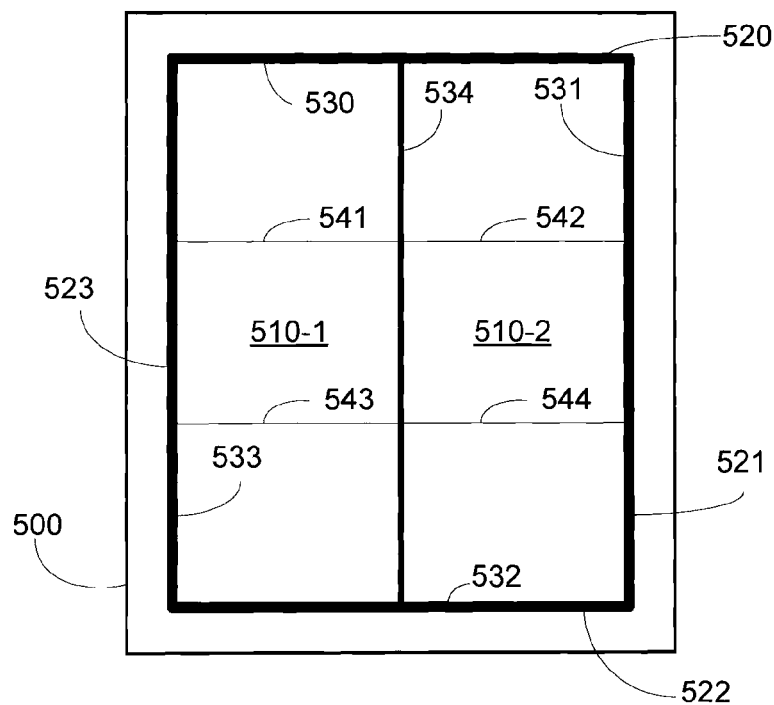
FIG. 5 is a schematic diagram of another embodiment of a mask reticle for a mask in a top layers masks option.

FIG. 5 is a schematic diagram of another embodiment of a mask reticle for a mask in a top layers masks option. More specifically, FIG. 5 is a schematic diagram of one embodiment of a mask reticle for a mask in a third top layers masks option, e.g., third top layers masks option 140 (shown in FIG. 1). In FIG. 5, mask reticle 500 includes two tiles 510-1 and 510-2. In one embodiment, each of tiles 510-1 to 510-2 is surrounded by an inner scribe line, such as inner scribe lines 530-534. Each tile is the smallest area defined by the scribe lines surrounding that tile. For example, tile 510-1 is the smallest area defined by scribe lines 530, 534, 532, and 533. Also, in one embodiment, tiles 510-1 to 510-2 are collectively surrounded by outer scribe lines 520-523. In one embodiment, outer scribe lines 520-523 are thicker than the inner scribe lines 530-534. In one embodiment, each of outer scribe lines 520-523 is 240 μm thick, whereas each of inner scribe lines 530-534 is 80 μm thick. In one embodiment, such as that shown in FIG. 5, outer scribe lines 520, 521, 522, and 523 are contiguous with inner scribe lines 530, 531, 532, and 533, respectively.

Mask reticle 500 also includes metalized tile-to-tile connections 541 to 544 for connecting three primitive size tiles to form tiles 510-1 to 510-2, each of which is three times as large as a primitive size tile. More specifically, metalized tile-to-tile connections 541 and 543 are for connecting three primitive tiles to form tile 510-1, and metalized tile-to-tile connections 542 and 544 are for connecting three primitive tiles to form tile 510-2.

In one embodiment, mask reticle 500 is 25 mm by 25 mm. Also, in one embodiment, each of tiles 510-1 to 510-2 is 10.237 mm by 24.048 mm. It is to be noted that tiles 510-1 to 510-2 in mask reticle 500 are three times as large as one of primitive tiles 210-1 to 210-6 in reticle 200 (shown in FIG. 2). In other words, mask reticle 500 is a mask for a top layer option used for fabricating an IC that has three times (×3) the resources in one of primitive tiles 210-1 to 210-6.

In reticle 500, tiles 510-1 and 510-2 are shown to share inner scribe line 534. In another embodiment, each of tiles 510-1 and 510-2 would be surrounded by its own inner scribe lines that are not shared with another tile. In such an embodiment, there may be a gap between the inner scribe line for one tile and the inner scribe line for another neighboring tile. For example, instead of only inner scribe line 534 between tiles 510-1 and 510-2, there would be two inner scribe lines, one for tile 510-1 and another for tile 510-2 and there would be a gap between the inner scribe line for tile 510-1 and the inner scribe line for tile 510-2.

Figure 6:
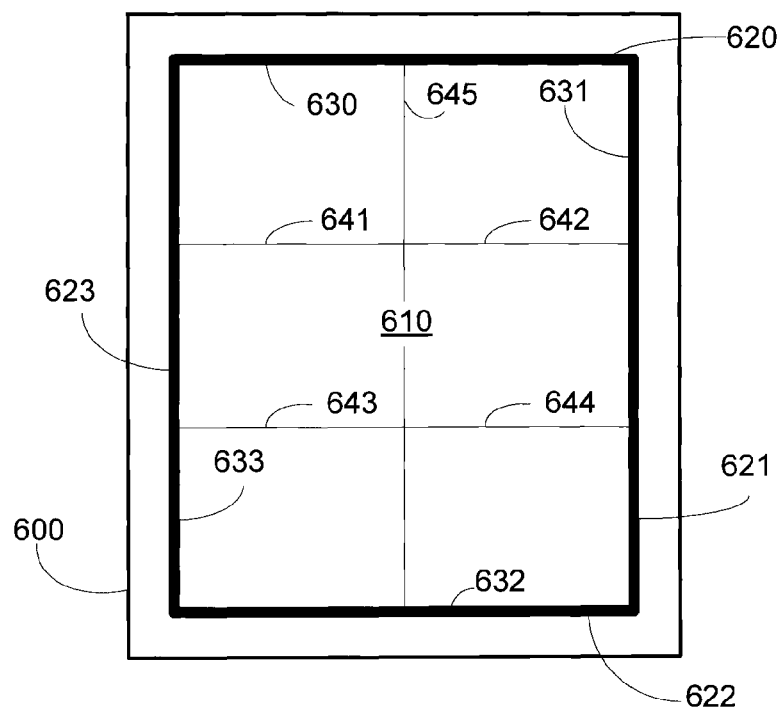
FIG. 6 is a schematic diagram of yet another embodiment of a mask reticle for a mask in a top layers masks option.

FIG. 6 is a schematic diagram of yet another embodiment of a mask reticle for a mask in a top layers masks option. More specifically, FIG. 6 is a schematic diagram of one embodiment of a mask reticle for a mask in a fourth top layers masks option, e.g., fourth top layers masks option 150 (shown in FIG. 1). In FIG. 6, mask reticle 600 includes one tile 610. In one embodiment, tile 610 is surrounded by inner scribe lines 630-633. Tile 610 is the smallest area defined by scribe lines 630-633 which surround tile 610. Also, in one embodiment, tile 610 is surrounded by outer scribe lines 620-623. In one embodiment, outer scribe lines 620-623 are thicker than the inner scribe lines 630-633. In one embodiment, each of outer scribe lines 620-623 is 240 μm thick, whereas each of inner scribe lines 630-633 is 80 μm thick. In one embodiment, such as that shown in FIG. 6, outer scribe lines 620, 621, 622, and 623 are contiguous with inner scribe lines 630, 631, 632, and 633, respectively.

Mask reticle 600 also includes metalized tile-to-tile connections 641 to 645 for connecting six primitive size tiles to form tile 610, which is six times as large as a primitive size tile.

In one embodiment, mask reticle 600 is 25 mm by 25 mm. Also, in one embodiment, tile 610 is 20.474 mm by 24.048 mm. It is to be noted that tile 610 in mask reticle 600 is six times as large as one of primitive tiles 210-1 to 210-6 in reticle 200 (shown in FIG. 2). In other words, mask reticle 600 is a mask for a top layers masks option used for fabricating an IC that has six times (×6) the resources in one of primitive tiles 210-1 to 210-6.

Figure 7:
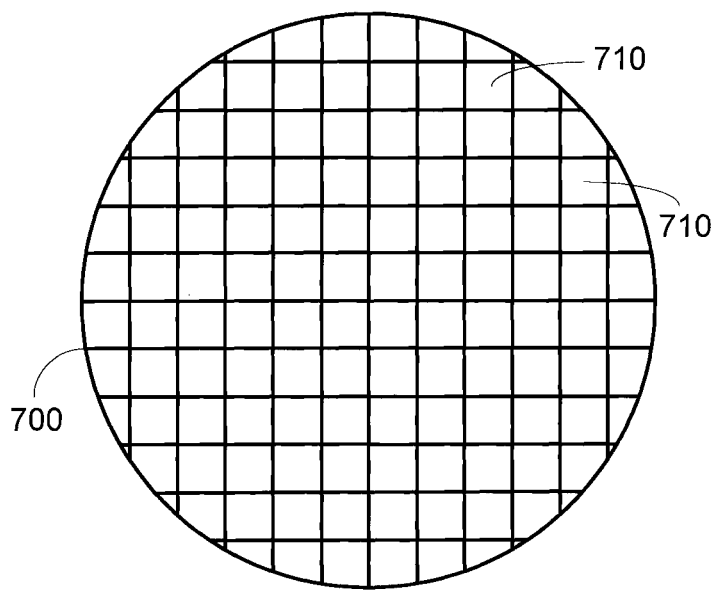
FIG. 7 is a schematic diagram of one embodiment of a wafer on which tile boundaries are shown.

FIG. 7 is a schematic diagram of one embodiment of a wafer on which tile boundaries are shown. More specifically, in FIG. 7, wafer 700 includes primitive tiles 710 (only two of which are designated with the reference number to avoid cluttering the drawing). Primitive tiles 710 are defined using the primitive tile size in base layers masks, such as base layers masks 110 (shown in FIG. 1), which, in one embodiment, are masks for fabricating up to the M6 layer in an IC.

Figure 8:
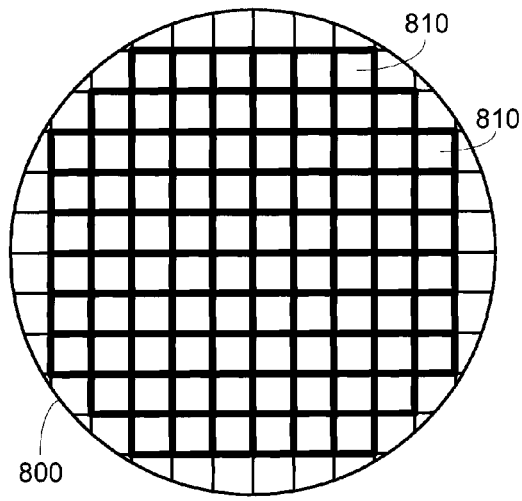
FIG. 8 is a schematic diagram of one embodiment of a wafer on which tile are shown.

FIG. 8 is a schematic diagram of one embodiment of a wafer on which tile are shown. In FIG. 8, wafer 800 includes tiles 810 (only two of which are designated with the reference number to avoid cluttering the drawing). Tiles 810 are defined using the tile size in top layers masks, such as first top layers masks option 120 (shown in FIG. 1), which, in one embodiment, are masks for fabricating layers M7 to AP of an IC. In one embodiment, tiles 810 are defined using mask reticles such as those shown in FIG. 3. Tiles 810 are the same size as primitive tiles 710 shown in FIG. 7. In one embodiment, tiles 810 represent ICs fabricated on wafer 800 using base layers masks 110 and first top layers masks option 120. As used herein an IC fabricated on a wafer may also at times be referred to a wafer die or IC chip. After fabrications of ICs represented by tiles 810, the ICs are cut from wafer 800 by cutting wafer 800 along the scribe lines represented by the boundaries of tiles 810.

Figure 9:
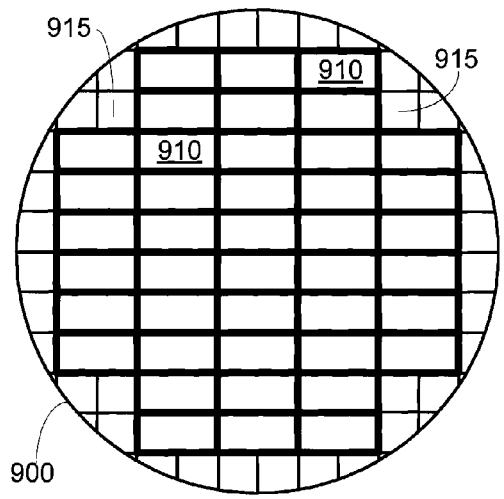
FIG. 9 is a schematic diagram of another embodiment of a wafer on which tiles are shown.

FIG. 9 is a schematic diagram of another embodiment of a wafer on which tiles are shown. In FIG. 9, wafer 900 includes tiles 910 (only two of which are designated with the reference number to avoid cluttering the drawing). Tiles 910 are defined using the tile size in top layers masks, such as second top layers masks option 130 (shown in FIG. 1), which, in one embodiment, are masks for fabricating layers M7 to AP of an IC. In one embodiment, tiles 910 are defined using mask reticles such as those shown in FIG. 4. Each of tiles 910 has twice the resources in a primitive tile 710 shown in FIG. 7. In one embodiment, each of tiles 910 represents an IC fabricated on wafer 900 using base layers masks 110 and second top layers masks option 130. After fabrication of ICs represented by tiles 910, the ICs are cut from wafer 900 by cutting wafer 900 along the scribe lines represented by the boundaries of tiles 910.

In one embodiment, the remaining ×1 size tiles 915 (only two of which are designated with reference numbers) are used to fabricate ICs having one times the resources in primitive tile 710. In one embodiment, in tiles 915, top layers of an IC (e.g., layers M7 to AP) are fabricated using top layers masks having tiles smaller than those of second top layers masks option 130, such as first top layers masks option 120 (shown in FIG. 1). After fabrication of ICs represented by tiles 915, those ICs are cut from wafer 900 by cutting along the scribe lines represented by the boundaries of the tiles 915. In one embodiment, ICs represented by tiles 910 are cut from wafer 900 after fabrication of ICs represented by tiles 915.

Figure 10:
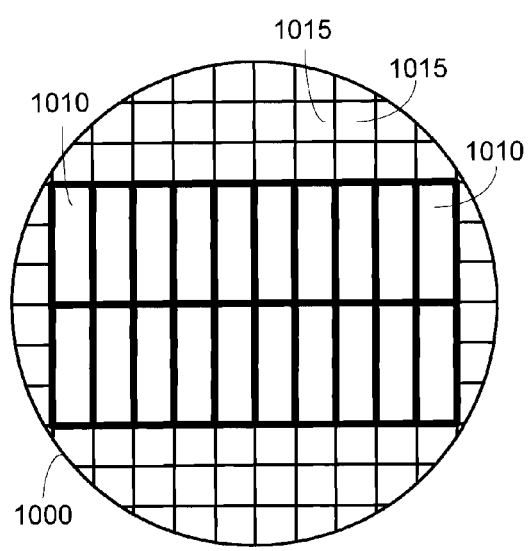
FIG. 10 is a schematic diagram of another embodiment of a wafer on which tiles are shown.

FIG. 10 is a schematic diagram of another embodiment of a wafer on which tiles are shown. In FIG. 10, wafer 1000 includes tiles 1010 (only two of which are designated with the reference number to avoid cluttering the drawing). Tiles 1010 are defined using the tile size in top layers masks, such as third top layers masks option 140 (shown in FIG. 1), which, in one embodiment, are masks for fabricating layers M7 to AP in an IC. In one embodiment, tiles 1010 are defined using mask reticles such as those shown in FIG. 5. Each of tiles 1010 has three times the resources in a primitive tile 710 shown in FIG. 7. In one embodiment, each of tiles 1010 represents an IC fabricated on wafer 1000 using base layers masks 110 and third top layers masks option 140. After fabrications of ICs represented by tiles 1010, the ICs are cut from wafer 1000 by cutting wafer 1000 along the scribe lines represented by the boundaries of tiles 1010.

In one embodiment, the remaining ×1 size tiles 1015 (only two of which are designated with reference numbers) are used to fabricate other ICs. In one embodiment, the size of these other ICs depends on the number of contiguous tiles 1015 that are available and their orientation. In one embodiment, these other ICs can have one times or two times the resources in primitive tile 710. In one embodiment, in tiles 1015, top layers of an IC (e.g., layers M7 to AP) are fabricated using top layers masks having tiles smaller than those of third top layers masks option 140, such as first top layers masks option 120 (shown in FIG. 1) or second top layers masks option 130 (shown in FIG. 1). After fabrication of ICs represented by tiles 1015, ICs that are one times or two times the size of primitive tile 710 are cut from wafer 1000 by cutting wafer 1000 along scribe lines represented by the boundaries of tiles 1015 that would produce ICs of the desired size. In one embodiment, ICs represented by tiles 1010 are cut from wafer 1000 after fabrication of ICs represented by tiles 1015.

Figure 11:
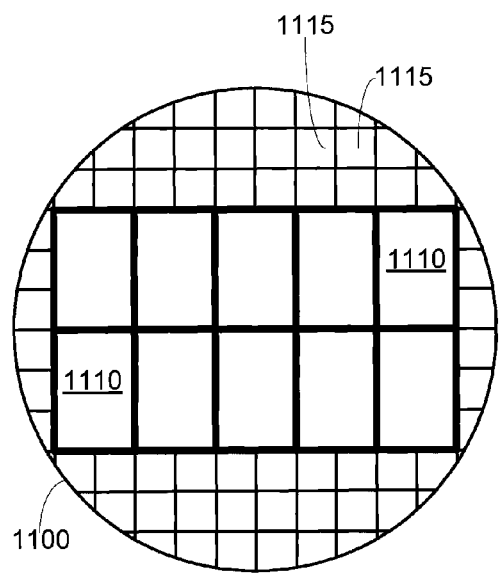
FIG. 11 is a schematic diagram of another embodiment of a wafer on which tiles are shown.

FIG. 11 is a schematic diagram of another embodiment of a wafer on which tiles are shown. In FIG. 11, wafer 1100 includes tiles 1110 (only two of which are designated with the reference number to avoid cluttering the drawing). Tiles 1110 are defined using the tile size in top layers masks, such as fourth top layers mask option 150 (shown in FIG. 1), which, in one embodiment, are masks for fabricating layers M7 to AP. In one embodiment, tiles 1110 are defined using mask reticles such as those shown in FIG. 6. Each of tiles 1110 has six times the resources in a primitive tile 710 shown in FIG. 7. In one embodiment, each of tiles 1110 represents an IC fabricated on wafer 1100 using base layers masks 110 and fourth top layers masks option 150. After fabrications of ICs represented by tiles 1110, the ICs are cut from wafer 1100 by cutting wafer 1100 along the scribe lines represented by the boundaries of the tiles 1110.

In one embodiment, the remaining ×1 size tiles 1115 (only two of which are designated with reference numbers) are used to fabricate other ICs. In one embodiment, the size of these other ICs depends on the number of contiguous tiles 1115 that are available and their orientation. In one embodiment, these other ICs can have one times, two times, or three times the resources in primitive tile 710. In one embodiment, in tiles 1115, top layers of an IC (e.g., layers M7 to AP) are fabricated using top layers masks having tiles smaller than those of fourth top layers masks option 150, such as first top layers masks option 120 (shown in FIG. 1), second top layers masks option 130 (shown in FIG. 1), or third top layers masks option 140 (shown in FIG. 1). After fabrication of IC represented by tiles 1115, ICs that are one times, two times, or three times the size of primitive tile 710 are cut from wafer 1100 by cutting wafer 1100 along scribe lines represented by the boundaries of tiles 1115 that would produce ICs of the desired size. In one embodiment, ICs represented by tiles 1110 are cut from wafer 1100 after fabrication of ICs represented by tiles 1115.

In one embodiment, if a portion of an IC of size ×2 or greater is defective, the non-defective part of that IC may continue to be used. For example, if one ×1 portion of an ×2 IC is defective, but the other ×1 portion of the ×2 IC is not defective, then the ×2 IC may be used as an ×1 IC.

In one embodiment, wafers 700 to 1100 are semiconductor wafers.

Figure 12:
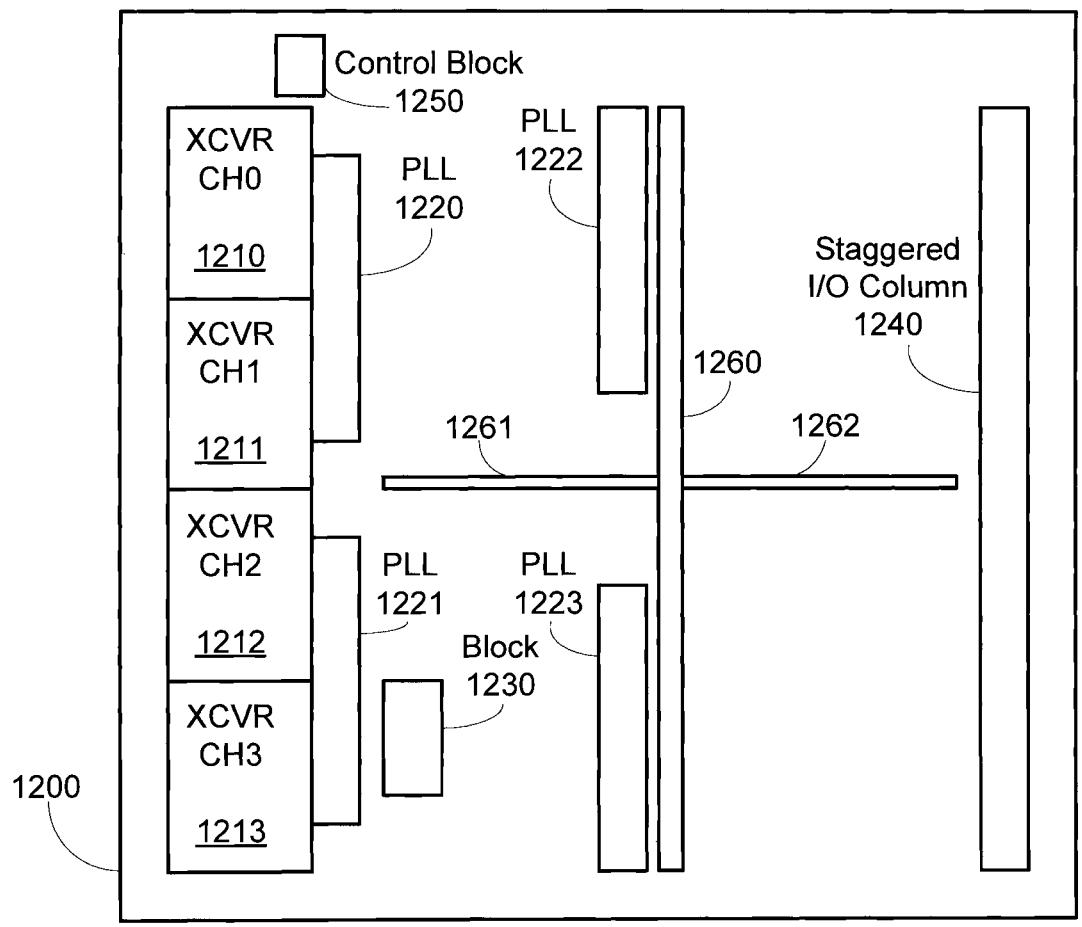
FIG. 12 is schematic detailed diagram of one embodiment of a primitive tile.

FIG. 12 is schematic detailed diagram of one embodiment of a primitive tile. More specifically, FIG. 12 is intended to illustrate the placement of some resources on a mask reticle of a primitive tile. In FIG. 12, primitive tile 1200 includes transceiver channels (XCVR CH) 0 to 3 which are referenced as 1210 to 1213, phase locked loop (PLL) blocks 1220 to 1223, hard resource block 1230, staggered input/output (I/O) column 1240, control block 1250, and programming register blocks 1260 to 1262. In one embodiment, there are twelve transceiver channels on primitive tile 1200, where each of the transceiver channels is a 6 Gigabits per second (Gps) transceiver channel. Also, in one embodiment, PLL blocks 1220 to 1223 are fracturable frationable PLLs (ffPLLs). Also, in one embodiment, there are 244 I/O devices in staggered I/O column 1240. Additionally, in one embodiment, there are 240× $10^3$ logic elements (LEs) (not shown) on primitive tile 1200. Furthermore, in one embodiment, there is a memory of 7.3 Mbits on primitive tile 1200. Moreover, in one embodiment, there are 752 digital signal processors (DSPs), where each of the DSPs is an 18×18 DSP.

Figure 13:
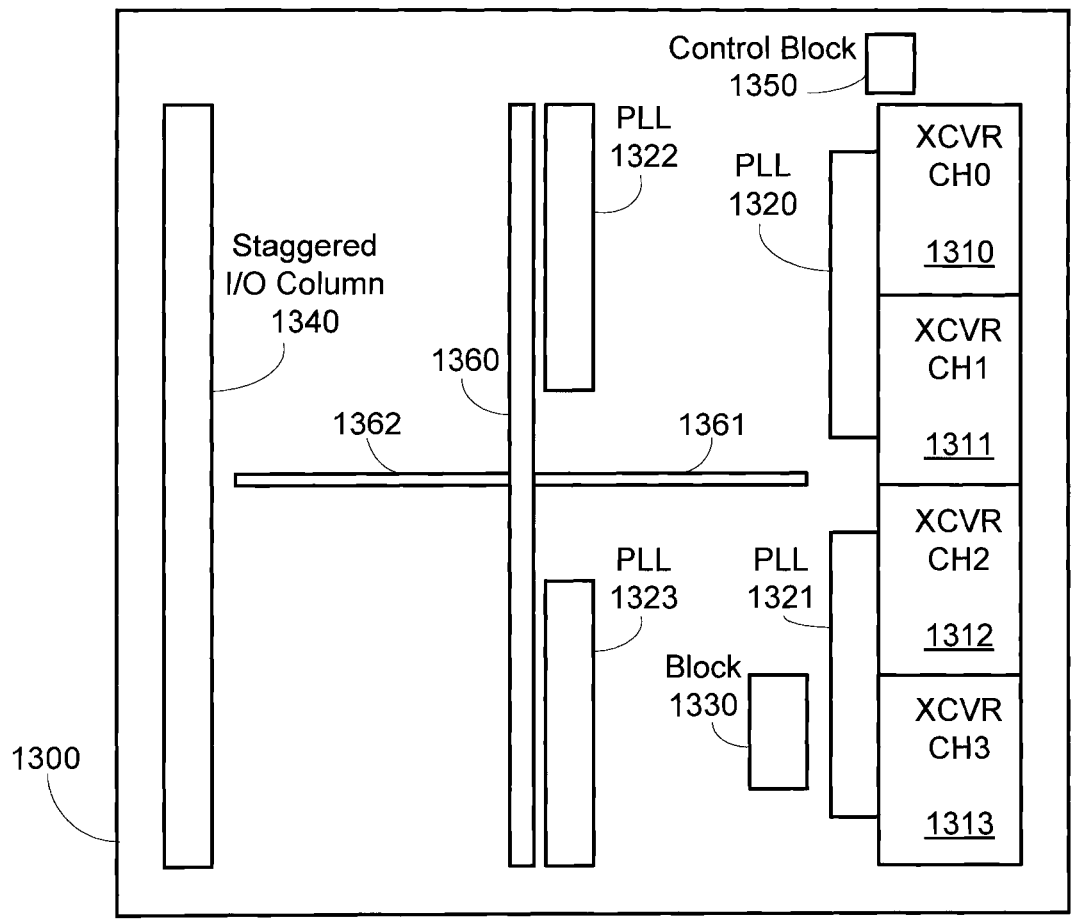
FIG. 13 is schematic detailed diagram of another embodiment of a primitive tile.

FIG. 13 is schematic detailed diagram of another embodiment of a primitive tile. More specifically, FIG. 13 is intended to illustrate the placement of some resources on another mask reticle of a primitive tile. In FIG. 13, primitive tile 1300 includes transceiver channels (XCVR CH) 0 to 3 which are referenced as 1310 to 1313, PLL blocks 1320 to 1323, hard resource block 1330, staggered I/O column 1340, control block 1350, and programming register blocks 1360 to 1362. In one embodiment, the size and resource count for primitive tile 1300 are the same as those set forth above for one embodiment of primitive tile 1200 (shown in FIG. 12).

More generally, in one embodiment, each of the primitive tiles in a base layers mask has the same amount of resources as each of the other primitive tiles in the base layers mask. This may herein be referred to as a homogenous tile concept. In another embodiment, the resource concentration in some of the primitive tiles in a base layers mask may be different from that of other primitive tiles in the same base layers mask. This may herein be referred to as a heterogeneous tile concept. For example, in one embodiment, the primitive tiles on the right hand side of a base layers mask may have a higher concentration of resources than the primitive tiles on the left hand side of the same base layers mask.

In one embodiment, primitive tile 1200 is a detailed diagram of primitive tile on a left hand side of mask reticle of a base layers mask, e.g., primitive tiles 210-1, 210-3, or 210-5 in mask reticle 200 (shown in FIG. 2). Also, in one embodiment, primitive tile 1300 is a detailed diagram of primitive tile on a right hand side of mask reticle of a base layers mask, e.g., primitive tiles 210-2, 210-4, or 210-4 in mask reticle 200 (shown in FIG. 2). In one embodiment, where primitive tile 1200 is on a left hand side of a mask reticle and primitive tile 1300 is on a right hand side of a mask reticle, transceivers are placed towards a right or left side of the mask reticle, I/O circuits are placed towards a middle portion of the mask reticle. In one embodiment, placement of transceivers towards a right or left side of the mask reticle and placement of I/O circuits towards a middle portion of the mask reticle provides improved timing for signals within the IC chip and between the IC chip and other devices.

In another embodiment, a mask reticle used for the base layers masks may have eight, rather than six, primitive tiles. In one embodiment, each primitive tile in a 25 mm by 25 mm mask reticle is 9.586 mm by 6.084 mm. Also, in one embodiment, each primitive tile in such a mask reticle includes 9 transceiver channels (each of which is a 6 Gps transceiver channel), 186 I/O circuits, and $150 \times 10^3$ LEs. In one embodiment, each such primitive tile includes 5.5 Mbits of memory and 544 DSPs, where each of the DSPs is an 18×18 DSP. Also, in one embodiment, the top layers masks options include a first top layers masks option, a second top layers masks option, a third top layers masks option, and a fourth top layers masks option which are used for fabricating ICs that have one times (×1), two times (×2), four times (×4), and eight times (×8), respectively, of the resources in the primitive tile. In such an embodiment, the one times (×1), two times (×2), four times (×4), and eight times (×8) ICs are 9.586 mm by 6.084 mm, 19.172 mm by 6.084 mm, 19.172 mm by 12.169 mm, and 19.172 mm by 24.337 mm, respectively.

In one embodiment, two separate ICs are fabricated on the same IC chip, but there are no communication lines within the IC chip between the two ICs. For example, in one embodiment, an IC chip may be fabricated using mask reticles such as mask reticle 200 (shown in FIG. 2) and mask reticle 500 (shown in FIG. 5) without cutting the chip along scribe line 534. As a result, the IC chip would have two ICs, each of which would have three times (×3) the resources on the primitive tile in mask reticle 200. In such a case, the two ICs on the IC chip would not have any communication lines between them on the IC chip. Moreover, someone observing the IC chip from the outside would not realize that the IC chip in fact has two separate ICs without any communication lines between the two separate ICs on the IC chip. Thus, in effect, there is a hard fence around each IC in the IC chip. In one embodiment, the two ICs may have different security restrictions. For example, in one embodiment, one IC may be for processing super top secret data, whereas the other IC may be for processing top secret data.

As noted above, using one set of base layers masks for fabricating ICs of different sizes provides considerable cost advantages. The cost advantages include reduced mask costs, reduced overall die costs, and reduced engineering costs. Furthermore, using one set of base layers masks provides for a faster turn around time (TAT). Additionally, using one set of base layers masks also provides for lower tool and infrastructure and layout expenses as it involves less overall verification and testing than using multiple sets of base layers masks.

In one embodiment, there are 43 base layers masks for fabricating an IC. Sharing this one set of base layers masks between four different size ICs allows for avoiding the costs of both designing and creating four different set of 43 base layers masks, one for each different size IC in the family of four different size ICs. The mask and engineering costs savings increase with an increasing number of different size ICs that share the same base layers masks.

In one embodiment, the primitive tile approach increases the per die costs as it involves duplication of resources (e.g., programming circuitry, programming logic control, and redundant inner scribe lines) on multiple primitive dies. However, as a result of the claw back of resources on a wafer, the yield is effectively increased for ICs other than the largest size IC in the IC family. As a result, the overall die cost for fabricating a large number of units of ICs is lowered. This is true for both IC devices with or without spare row(s), i.e., redundancy.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A mask set comprising:
   a first layer mask including a plurality of first tiles of a first tile size; and
   a second layer mask including a plurality of second tiles of a second tile size,
   wherein the second tile size is different from the first tile size and wherein the first layer mask is for fabricating a first layer of an integrated circuit (IC) and the second layer mask is for fabricating a second layer of the IC.

2. The mask set of claim 1, wherein the mask set is for fabricating a family of ICs.

3. The mask set of claim 1, wherein the first layer mask is for fabricating the first layer of the IC at a first fabrication process node and the second layer mask is for fabricating the second layer of the IC at a second fabrication process node, wherein the second fabrication process node is different from the first fabrication process node.

4. The mask set of claim 1, wherein the first layer mask is a first layer mask reticle, wherein the first layer mask reticle includes a first plurality of tiles, wherein each tile of the first plurality of tiles has the first tile size, further wherein each tile of the first plurality of tiles includes resources of the IC.

5. The mask set of claim 4, wherein in each tile, a transceiver is placed towards a right or left side of the first layer mask reticle, further wherein, in each tile, an input/output (I/O) circuit is placed towards a middle portion of the first layer mask reticle.

6. The mask set of claim 1, wherein the second layer mask is a second layer mask reticle, wherein the second layer mask reticle includes one or more tiles, wherein each of the one or more tiles has the second tile size.

7. The mask set of claim 1, wherein the mask set is for fabricating a first integrated circuit (IC) and a second IC, wherein the first IC and the second IC are fabricated on one IC chip and there are no communication lines within the one IC chip between the first IC and the second IC.

8. The mask set of claim 1 further comprising:
a third layer mask including a plurality of third tiles of a third tile size, wherein the third tile size is smaller than the second tile size and greater than or equal to the first tile size,
wherein the mask set is used to fabricate a first IC of the second tile size and a second IC of the third tile size on one wafer.

9. A mask set comprising:
a first plurality of layers masks, wherein each layer mask of the first plurality of layers masks includes a first plurality of tiles, wherein each tile of the first plurality of tiles has a first tile size, further wherein the first plurality of layers masks are for fabricating a first plurality of layers of an integrated circuit (IC); and
a second plurality of layers masks, wherein each layer mask of the second plurality of layers masks includes a second plurality of tiles, wherein each tile of the second plurality of tiles has a second tile size, further wherein the second plurality of layers masks are for fabricating a second plurality of layers of the IC,
wherein the second tile size is different from the first tile size.

10. A method of fabricating a plurality of integrated circuits (ICs), the method comprising:
using a first layer mask having a first tile size to fabricate a first layer of a first IC of the plurality of ICs and a first layer of a second IC of the plurality of ICs; and
using a second layer mask having a second tile size to fabricate a second layer of the first IC, wherein the second tile size is different from the first tile size.

11. The method of claim 10, wherein the first and second layers of the first IC are on a wafer, the method further comprising:
cutting the first IC from the wafer, wherein the first IC has the second tile size.

12. The method of claim 11 further comprising:
using a layer mask having the first tile size or a third tile size to fabricate a second layer of the second IC, wherein the third tile size is smaller than the second tile size and larger than the first tile size; and
cutting the second IC from the wafer, wherein the second IC has the first tile size or the third tile size.

13. The method of claim 10, wherein the first layer is fabricated at a first fabrication process node and the second layer is fabricated at a second fabrication process node, wherein the second process fabrication node is different from the first fabrication process node.

14. The method of claim 10, wherein the first layer mask is a first layer mask reticle, wherein the first layer mask reticle includes a first plurality of tiles, wherein each tile of the first plurality of tiles has the first tile size, further wherein each tile of the first plurality of tiles includes resources of an IC.

15. The method of claim 14, wherein in each tile, a transceiver is placed towards a right or left side of the first layer mask reticle, further wherein, in each tile, an input/output (I/O) circuit is placed towards a middle portion of the first layer mask reticle.

16. The method of claim 10, wherein the second layer mask is a second layer mask reticle, wherein the second layer mask reticle includes one or more tiles, wherein each of the one or more tiles has the second tile size.

17. The method of claim 10, wherein a third IC and a fourth IC of the plurality of ICs are fabricated on one IC chip and there are no communication lines within the one IC chip between the third IC and the fourth IC.

18. The method of claim 10, wherein the using the second layer mask having the second tile size to fabricate a second layer of the first IC also fabricates a second layer of the second IC, wherein the first IC and the second IC are of equal size.

19. The method of claim 10 further comprising:
using a third layer mask having a third tile size to fabricate a second layer of the second IC, wherein the third tile size is different from the first tile size and the second tile size, further wherein the first IC and the second IC are fabricated on one wafer.

* * * * *